United States Patent
Park

(10) Patent No.: US 7,696,681 B2
(45) Date of Patent: Apr. 13, 2010

(54) STACKED ORGANIC ELECTROLUMINESCENT UNITS FOR WHITE LIGHT EMISSION PROVIDED WITH RGB COLOR CONVERSION PORTIONS

(75) Inventor: Jae Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 680 days.

(21) Appl. No.: 11/008,825

(22) Filed: Dec. 23, 2004

(65) Prior Publication Data

US 2005/0140275 A1   Jun. 30, 2005

(30) Foreign Application Priority Data

Dec. 29, 2003   (KR) .................. 10-2003-0099398

(51) Int. Cl.
*H01L 51/50*   (2006.01)
*H01L 51/52*   (2006.01)
*H05B 33/02*   (2006.01)

(52) U.S. Cl. ................. 313/503; 313/504; 313/505; 313/506

(58) Field of Classification Search ......... 313/500–512; 428/690
See application file for complete search history.

(56) References Cited

U.S. PATENT DOCUMENTS

| 2001/0000005 A1 | 3/2001 | Forrest et al. |
| 2003/0170491 A1 * | 9/2003 | Liao et al. ................. 313/504 |
| 2003/0178936 A1 * | 9/2003 | Park et al. ................. 313/505 |
| 2003/0189401 A1 * | 10/2003 | Kido et al. ................. 313/504 |
| 2007/0182317 A1 | 8/2007 | Kido et al. |

FOREIGN PATENT DOCUMENTS

| CN | 1438828 | 8/2003 |
| CN | 1446032 | 10/2003 |
| CN | 1447629 | 10/2003 |
| JP | 2003-272860 | 9/2003 |
| KR | 2003-0075771 | 9/2003 |

* cited by examiner

*Primary Examiner*—Mariceli Santiago
(74) *Attorney, Agent, or Firm*—Morgan Lewis & Bockius LLP

(57) ABSTRACT

An organic electroluminescence device includes an array element divided into sub-pixels and including thin film transistors formed in the sub-pixels; a color conversion portion disposed below a second substrate and including a red (R), green (G) and blue (B) conversion layer for converting white light into three primary colors of red (R), green (G) and blue (B); a first electrode disposed below the color conversion portion and including a transparent conductive material; an organic EL layer disposed below the first electrode in the sub-pixels and including a plurality of stack units each including a charge generation layer, an electrode transporting layer, a hole transporting layer and an emission layer; a second electrode patterned below the organic EL layer in the sub-pixels; and a conductive spacer electrically connecting the thin film transistors with the second electrode.

6 Claims, 4 Drawing Sheets

STACKED ORGANIC ELECTROLUMINESCENT UNITS FOR WHITE LIGHT EMISSION PROVIDED WITH RGB COLOR CONVERSION PORTIONS

The present invention claims the benefit of the Korean Application No. 99398/2003 filed on in Korea Dec. 29, 2003, which is hereby incorporated by reference.

BACKGROUND OF THE INVENTION

1. Field of the Invention

The present invention relates to a light emitting device, and more particularly, to an organic electroluminescence (EL) device.

2. Discussion of the Related Art

Among flat panel displays, an organic electroluminescence (EL) device is a self-emission type display with higher contrast and wider viewing angle as compared to a liquid crystal display (LCD). The organic EL device can be made lightweight and slim profile as compared to other display types because it does not require a backlight. The organic EL device also uses less power than other types of flat panel displays. Further, the organic EL device can be driven with a low DC voltage and still have a rapid response rate. Since all of the components of the organic EL device are formed of solid materials, it can withstand an impact. The organic EL device can operate throughout a wide temperature range and be manufactured at a low cost. Unlike fabricating an LCD or a PDP, the organic EL device is manufactured just using a deposition process and an encapsulation process. Thus, the manufacturing processes and apparatuses for making an organic EL device are very simple.

A passive matrix type organic EL device without a switching element has been widely used. In the passive matrix type, gate lines (scan lines) cross data lines (signal lines) to define a matrix of sub-pixels. The gate lines are sequentially driven to drive each sub-pixel. To exhibit a required mean luminescence, a higher level of moment luminance must be emitted sequentially in each sub-pixel across the display to create an overall average luminance.

In an active matrix type, thin film transistors acting as switching elements are located in respective sub-pixels. The voltage applied to the sub-pixels are charged in a storage capacitor Cst so that the voltage can be applied until a next frame signal is applied, thereby continuously driving the organic EL device, regardless of the number of gate lines, to display a picture. Accordingly, in the active matrix type, even when low current is applied, uniform luminescence can be obtained. As a result, the organic EL device has the advantages of low power consumption, high definition and large-sized screen capability. Such an active matrix type organic EL device will now be described with reference to the accompanying drawings.

FIG. 1 is a cross-sectional view schematically showing a bottom emission organic EL device according to the related art, wherein a unit pixel region includes red (R), green (G) and blue (B) sub-pixels. As shown in FIG. 1, the related art bottom emission organic EL device includes a first substrate 10 and a second substrate 30 facing each other and sealed by a seal pattern 40. The first substrate 10 includes a transparent substrate 1, thin film transistors T formed in each sub-pixel on the transparent substrate 1, first electrodes 12 connected with the thin film transistors T, an organic EL layer 14 connected with the thin film transistors T and disposed corresponding to the first electrodes 12 on the thin film transistors T, and a second electrode 16 formed on the organic EL layer 14. The organic EL layer 14 includes emission materials emitting red (R), green (G) and blue colors. The first and second electrodes 12 and 16 apply an electric field to the organic EL layer 14.

The second electrode 16 is spaced away from the second substrate 30 by the seal pattern 40. A moisture absorbent (not shown) for preventing moisture from leaking to an outside is filled into an inner surface of the second substrate 30 and fixed by a semi-transparent tape (not shown). In the related art bottom emission structure, the first electrode 12 serves as an anode and is selected from a group consisting of transparent conductive materials, whereas the second electrode 16 serves as a cathode and is selected from a group consisting of metal materials having a low work function. Thus, the organic EL layer 14 has a stack structure where a hole injection layer 14a, a hole transporting layer 14b, an emission layer 14c, an electron transporting layer 14d that are sequentially stacked starting from the hole injection layer 14a contacting the first electrode 12. Herein, the emission layer 14c has a structure in which the emission materials emitting red (R), green (G) and blue colors are sequentially arranged corresponding to the respective sub-pixels.

The related art organic EL device has a limitation in fine-patterning the red (R), green (G) and blue pixels with high reproduction under a large area. For example, since the organic EL material for the organic EL layer 14 is vulnerable to solvent or moisture, it cannot be patterned by a wet etch. For this reason, the organic EL material cannot be patterned by photolithography, which is advantageous in forming fine patterns.

Low molecular organic EL material can be patterned by a method including installing a fine-patterned shadow mask on a substrate and then independently forming R, G, B materials. However, this method is limited in precisely fabricating the shadow mask to have fine patterns over a resolution of a predetermined level and employing the shadow mask in a high definition and large area due to the tension deviation of the shadow mask and the like. Also, another pixel patterning method using a high molecular organic EL material inkjet injection head has been researched, but it is difficult for forming a pinhole-free thin film less than 1000 Å.

The related art bottom emission structure organic EL devices are fabricated by attaching the first substrate 10 provided with an array device and an organic EL diode to the second substrate 30 for separate encapsulation. Thus, a yield of the organic EL display is determined by both of a yield of the array device and a yield of the organic EL diode, and therefore, an overall process yield is greatly limited to a latter process, namely, the process of forming the organic EL diode. For example, even though the array device is formed excellently, if defects occur due to foreign matters or other factors in forming the organic EL layer employing a thin film of about 1000 Å thick, the entire organic EL device is rendered defective. Consequently, a defective organic EL layer results in decreased production yield and increased material costs in manufacturing the non-defective array element associated with the defective organic EL layer.

In addition, since the bottom emission structure has high stability and high process freedom because of the encapsulation, but has a limitation in the aperture ratio, it is suitable to employ the bottom emission structure for high resolution products.

SUMMARY OF THE INVENTION

Accordingly, the present invention is directed to an organic EL device that substantially obviates one or more problems due to limitations and disadvantages of the related art.

An object of the present invention is to provide a dual panel type organic EL device that is capable of obtaining a high color purity by forming an organic EL layer in a stack structure including a charge generation layer, an electrode transporting layer, a hole transporting layer, and an emission layer including red (R), green (G) and blue (B) emission materials, so that the dual panel type organic EL device can exhibit full colors using a color conversion medium (CCM)/color filter or a color filter.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided an organic EL device including: a first substrate and a second substrate spaced apart from each other by a predetermined interval and facing each other; an array element divided into sub-pixels and including thin film transistors formed in the sub-pixels; a color conversion portion disposed below the second substrate and including a red (R), green (G) and blue (B) conversion layer for converting white light into three primary colors of red (R), green (G) and blue (B); a first electrode disposed below the color conversion portion and including a transparent conductive material; an organic EL layer disposed below the first electrode in the sub-pixels and including a plurality of stack units each including a charge generation layer, an electrode transporting layer, a hole transporting layer and an emission layer; a second electrode patterned below the organic EL layer in the sub-pixels; and a conductive spacer electrically connecting the thin film transistors with the second electrode.

In another aspect, the method of fabricating the organic EL device includes a first substrate and a second substrate spaced apart from each other by a predetermined interval and facing each other; an array element divided into sub-pixels and including thin film transistors formed in the sub-pixels; color filters disposed below the second substrate; a first electrode disposed below the color filters and including a transparent conductive material; an organic EL layer disposed below the first electrode in the sub-pixels and including a plurality of stack units each including a charge generation layer (CGL), an electrode transporting layer (ETL), a hole transporting layer (HTL) and an emission layer (EMT); a second electrode patterned below the organic EL layer in the sub-pixels; and a conductive spacer electrically connecting the thin film transistors with the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
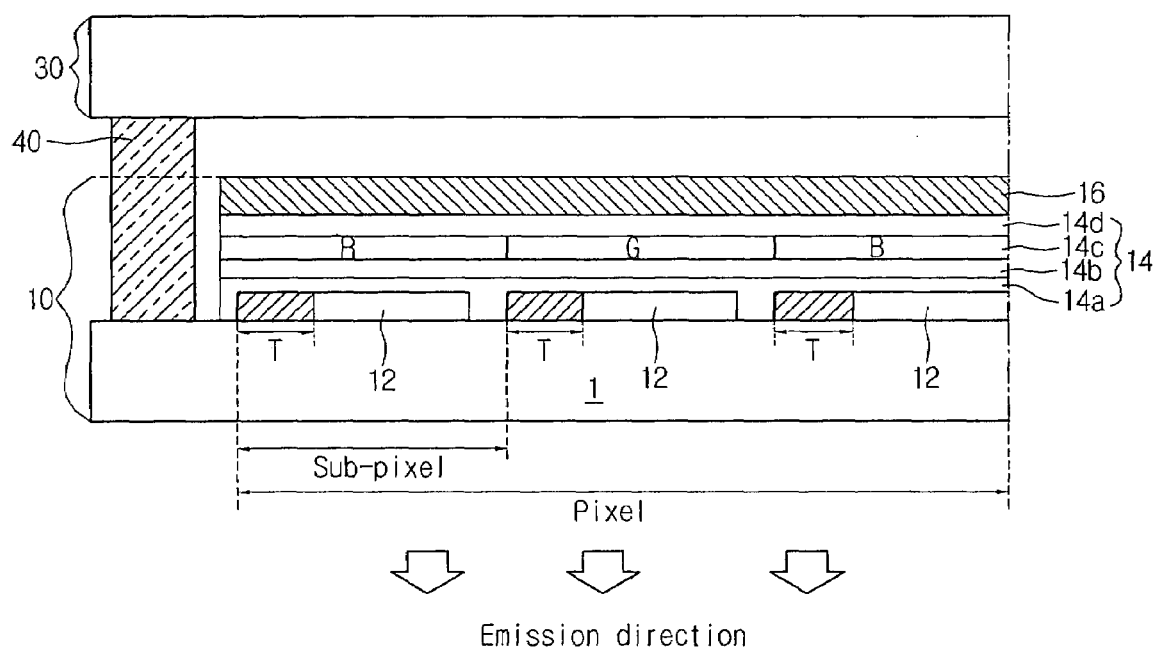
FIG. 1 is a cross-sectional view schematically showing a bottom emission organic EL device according to the related art.
Figure 2:
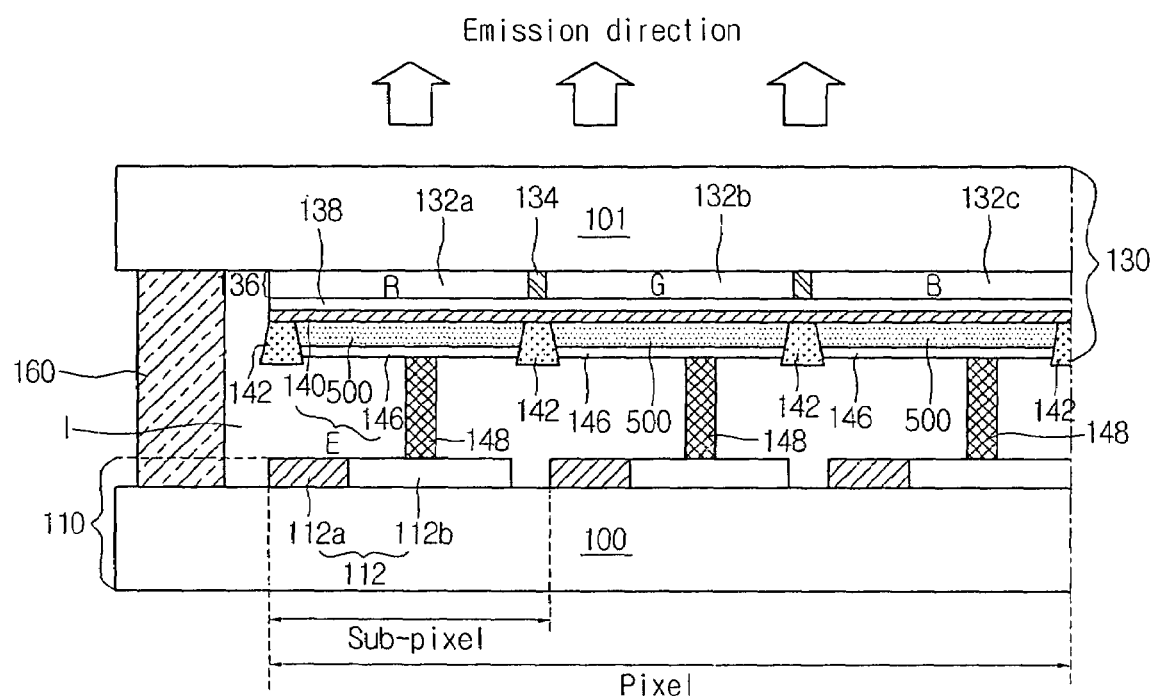
FIG. 2 is a cross-sectional view schematically showing an organic EL device according to an exemplary embodiment of the present invention.

FIG. 2 is a cross-sectional view schematically showing a dual panel type organic EL device that exhibits colors in a color conversion medium (CCM) according to an exemplary embodiment of the present invention. The dual panel type organic EL device is capable of overcoming the drawbacks of the related art bottom emission type organic EL device. As shown in FIG. 2, the dual panel type organic EL device includes a first substrate 110 and a second substrate 130 disposed facing each other and attached by a seal pattern 160.

The first substrate 110 includes a transparent substrate 100 and an array element 112 formed on the transparent substrate 100. The second substrate 130 includes a transparent substrate 101, and a color conversion portion 136. The color conversion portion 136 including red (R), green (G) and blue (B) color conversion layers 132a, 132b and 132c sequentially arranged in a horizontal direction in the sub-pixel, and a black matrix (BM) layer 134 formed at boundaries between the R, G, B color conversion layers 132a, 132b and 132c to prevent color interference between colors and light leakage.

An overcoat layer 138 is deposited beneath the color conversion portion 136, and a first electrode 140 is deposited as a common electrode below the overcoat layer 138. The first electrode 140 may be made of a conductive material with light transmission capability. A trapezoidal electrode separator 142 of insulator is disposed at boundaries of the sub-pixels below the first electrode 142. An organic EL layer 500 and a second electrode 146 are independently disposed between the adjacent electrode separators 142 and correspond to each sub-pixel. Moreover, the color conversion portion 136 may include R, G and B color filters. Since the electrode separator 142 serves to pattern the second electrode 146 in each sub-pixel, the electrode separator 142 preferably has a trapezoidal structure in which width is reduced from the second electrode 146 to the first electrode 140.

The seal pattern 160 is formed along an edge between the first and second substrates 110 and 130 to attach them and to maintain a constant cell gap. The array element 112 on the first substrate 110 includes a thin film transistor 112a as a switching element, and an electrical connector 112b connected with the thin film transistor 112a. Conductive spacers 148 for electrically connecting the electrical connectors 112b of the first substrate 110 with the second electrode 146 of the second substrate 130 are formed in each sub-pixel. The thin film transistor 112a corresponds to a drive transistor connected with the organic EL diode E. The electrical connector 112b may correspond to any of source and drain electrodes (not shown) of the thin film transistor 112a, or may be made of a separate conductive material connected with the source and drain electrodes.

The organic EL layer 500 has a multi-layered structure depending on the arrangement of anode and cathode. In one example, when the first electrode 140 and the second electrode 146 are designed to be a cathode and an anode, respectively, the organic EL layer 500 has the multi-layered structure such that a hole injection layer contacting the first electrode 140, a hole transporting layer, an emission layer, an electron transporting layer, an electron injection layer are sequentially arranged. Moreover, the conductive spacers 148 connecting the second electrode 146 with the thin film transistor 112a are formed between the second electrodes 146 and the electrical connectors 112b.

Unlike the general spacer used in a liquid crystal display (LCD), the conductive spacers 148 are used to electrically connect the two substrates as well as to maintain a cell gap between the two substrates 110 and 130, and each have a column shape having a predetermined height. In this exemplary embodiment, the conductive spacers 148 are formed by coating a conductive film on an insulator column spacer to electrically connect the two substrates 110 and 130 and also serve as spacers. Preferably, the conductive metal film coating the conductive spacer 148 is flexible and made of one selected from the group of metal materials having a low resistivity. The conductive spacer 148 may be formed during a process of forming an array device of the first substrate 110.

The above dual panel type organic EL device is a top emission type that emits light generated from the organic EL layer 500 toward the second substrate 130. Accordingly, the first electrode 140 should be selected from the group consisting of transparent conductive materials. If the first electrode 140 serves as an anode, it may be made of ITO. On the other hand, if the first electrode 140 serves as a cathode, it is preferably made of a semi-transparent metal material having a low work function. The semi-transparent metal material may be selected from the group consisting of aluminum (Al), an alloy of magnesium (Mg) and Al (hereinafter referred to as 'Mg:Al'), Al:Li and Al:benzonate. In addition, since the second electrode 146 is an electrode positioned at a rear side of the light emission direction, it is preferably selected from the group consisting of opaque metal materials. Thus, when the second electrode 146 serves as an anode, the second electrode 146 is made of ITO and the opaque metal material may be further provided so as to perform as a reflective plate. As shown in FIG. 2, there is an interval space I created between the first substrate 110 and the second substrate 130. It is preferably to forms the interval space I in an inert gas ambient.

It is noted that the dual panel type organic EL device exhibiting full colors using the color conversion medium (CCM)/color filter has a disadvantage in that the light emitted from the organic EL layer 500 may be somewhat lost while passing through the color filter or the color conversion layers 132a, 132b and 132c. Accordingly, to overcome the above disadvantage, the organic EL layer 500 may be designed to have a multi-photon emission (MPE) structure to emit R, G and B colored lights, thereby enhancing color purity.

By applying the construction of the exemplary embodiment to an organic EL device using amorphous silicon (a-Si) TFT as a drive element, high efficiency and high color purity can be obtained, and pixel currents required for R, G and B pixels can be reduced. Further, current ratios required to the R, G and B pixels are greatly influenced by a color coordinate of each color. According to the exemplary embodiment, the current ratios required are adjusted at a constant value, thereby preventing one color from being first degenerated.

Figure 3:
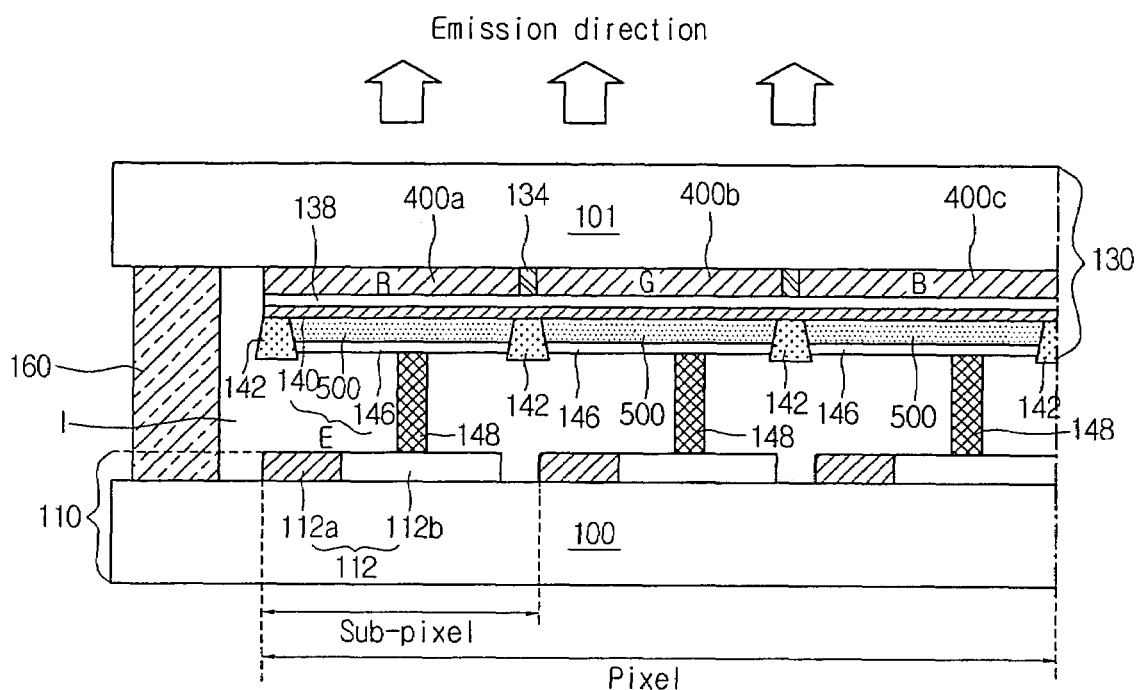
FIG. 3 is a cross-sectional view schematically showing an organic EL device according to another exemplary embodiment of the present invention.

FIG. 3 is a cross-sectional view schematically illustrating an organic EL device according to another embodiment of the present invention. As shown in FIG. 3, the organic EL device is different from the organic EL device shown in FIG. 2 in that color filters 400a, 400b and 400c and organic EL layer 500 emitting white light are provided to exhibit full colors. Since other elements of the organic EL device shown in FIG. 3 other than the color filters 400a, 400b and 400c and the organic EL layer 500 are the same as those of the organic EL device shown in FIG. 2, like reference numerals are used to indicate like elements, and their descriptions are omitted. Moreover, in the organic EL device of FIG. 3, the color conversion portion 136 except for the color conversion layers 132a, 132b and 132c and the black matrix layer 134 is not formed by employing the color filters 400a, 400b and 400c and the organic EL layer 500 emitting white light.

Figure 4:
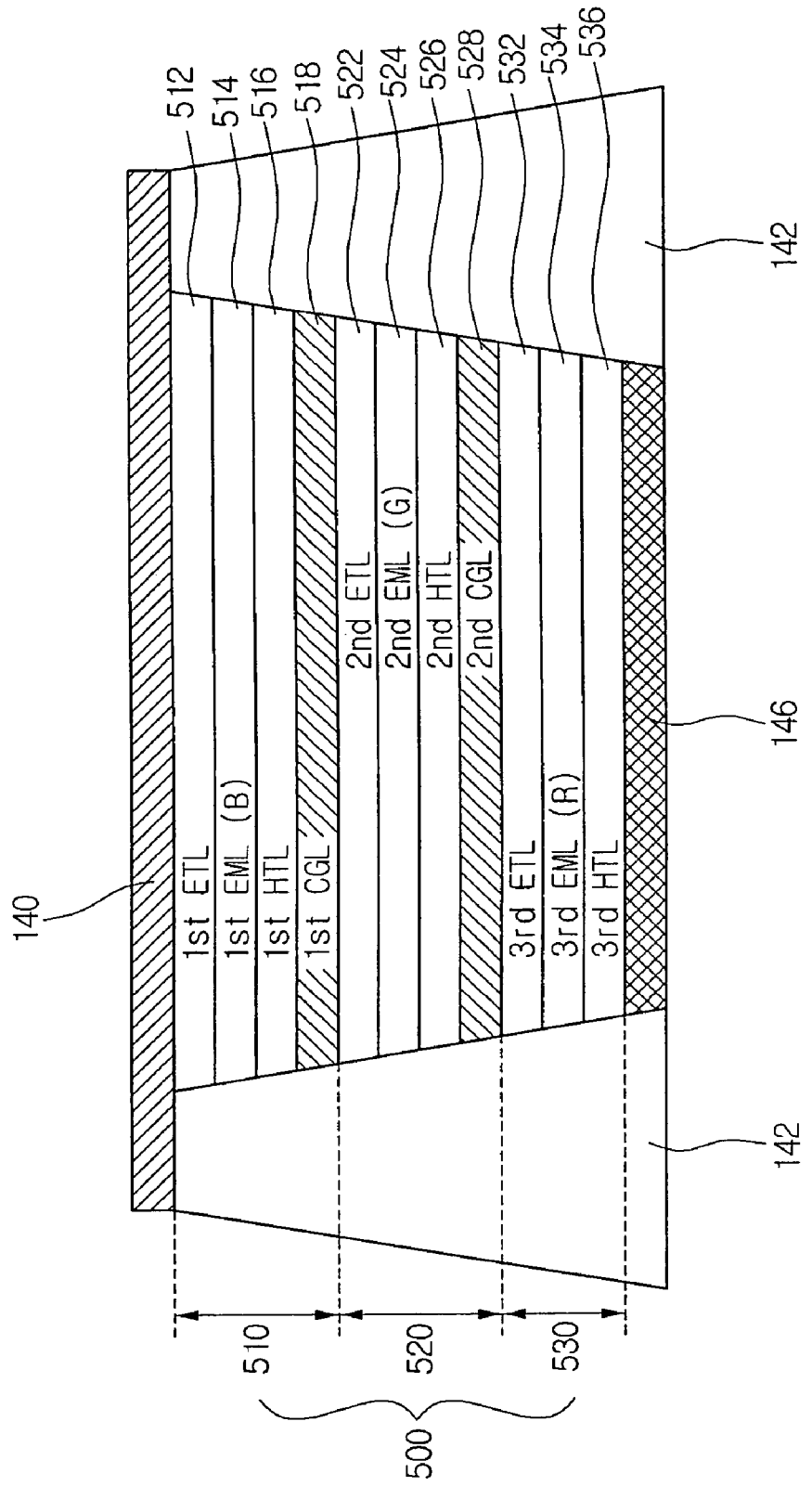
FIG. 4 is a cross-sectional view illustrating a an organic EL layer disposed on in the organic EL devices shown in FIGS. 2 and 3.

In the exemplary embodiment of FIG. 3, the organic EL layer 500 includes the multi-photo emission structure to emit R, G and B colored lights, thereby enhancing the color purity. The detailed structure of the organic EL layer 500 shown in FIGS. 2 and 3 will now be described with reference to FIG. 4. FIG. 4 is a detailed sectional view of the organic EL layer shown in FIGS. 3 and 4. As shown in FIG. 5, the organic EL layer 500 is formed between the trapezoidal electrode separators 142 and the second electrode 146.

The MPE structure of the organic EL layer 500 includes a plurality of stack units including at least a first stack unit 510, a second stack unit 520 and a third stack unit 530. Each stack unit includes charge generation layers 518 and 528, electron transporting layers 512, 522 and 532, hole transporting layers 516, 526 and 536, and emission layers 514, 524 and 534. Herein, each of the emission layers 514, 524 and 534 includes R, G and B emission materials. Specifically, if the first electrode 140 is cathode and the second electrode 146 is anode, then the first stack unit 510 includes the electron transporting layer 512 contacting the first electrode 140, the emission layer 514 containing blue 'B' emission material, the hole transporting layer 516 and the charge generation layer 518; a second stack unit 520 includes the electron transporting layer 522 disposed below the charge generation layer 518, the emission layer 524 containing green 'G' emission material, the second hole transporting layer 526 and the charge generation layer 528; and the third stack unit 530 includes the electron transporting layer 532 disposed below the charge generation layer 528, the emission layer 534 containing red 'R' emission material and the hole transporting layer 536.

The hole transporting layer 536 of the third stack unit 530 has a lower surface contacting the second electrode 146. The third stack unit 530 is not provided with a charge generation layer because the second electrode 146 may serve as the charge generation layer. The charge generation layers may be made of V2O5, the electron transporting layers 512, 522 and 532 may be made of Cs:BCP, and the hole transporting layers 516, 526 and 536 may be made of α-NPD.

When power is applied to the first and second electrodes 140 and 146, the charge generation layers 518 and 528 use the applied power to generate charges, i.e., electrons and holes and provide these charges to the adjacent electron transporting layers 512, 522 and 532 and the hole transporting layers 516, 526 and 536. For example, when power is applied to the organic EL layer of this exemplary embodiment, charges are generated inside the charge generation layer 518, and holes are supplied to the hole transporting layer 516 and then introduced into the emission layer 514, whereas electrons is supplied to the electron transporting layer 522 and then introduced into the emission layer 524.

The above operation may be equally applied to the charge generation layer 528. As a consequence, when power is applied to the organic EL layer 500, the emission layers 514, 524 and 534 emit blue, green and red lights, independently. In other words, in the exemplary embodiment, the MPE structure of the organic EL layer serves to emit red, green and blue lights independently, thereby obtaining high color purity.

According to the organic EL device of the present invention, the organic EL layer includes a stack structure in which the charge generation layer, the red, green and blue emission material layers are sequentially stacked, thereby enhancing the color purity. Thus, the current ratios required to the red, green and blue lights are constantly maintained, thereby preventing one color from being degenerated and contributing to a long life span of the device.

It will be apparent to those skilled in the art that various modifications and variations can be made in the organic EL device of the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) device, comprising:
   a first substrate and a second substrate spaced apart from each other by a predetermined interval and facing each other;
   an array element disposed below the first substrate, divided into sub-pixels and including thin film transistors formed in the sub-pixels;
   an electrode separator at a boundary of the sub-pixel and below the first electrode;
   a color conversion portion disposed below the second substrate and including a red (R), green (G) and blue (B) conversion layer sequentially arranged in a unit of sub-pixel for converting a white light into three primary colors of red (R), green (G) and blue (B);
   a first electrode disposed below the color conversion portion and including a transparent conductive material;
   an organic EL layer disposed below the first electrode in the sub-pixels, independently arranged in the unit of sub-pixel and including a plurality of stack units each including a charge generation layer, an electrode transporting layer, a hole transporting layer and an emission layer, wherein the organic EL layer includes a first stack unit including a first electron transporting layer contacting the first electrode, the first emission layer containing a blue emission material, a first hole transporting layer and a first charge generation layer that are sequentially disposed starting from the first electron transporting layer, the second stack unit including a second electron transporting layer, the second emission layer containing a green emission material, a second hole transporting layer, and a second charge generation layer that are disposed below the first charge generation layer and the third stack unit including a third electron transporting layer, the third emission layer containing a red emission material and a third hole transporting layer that are disposed below the second charge generation layer, wherein the organic EL layer provides the white light to the color conversion portion,
   a second electrode patterned independently arranged in the unit of sub-pixel below the organic EL layer in the sub-pixels; and
   a conductive spacer electrically connecting the thin film transistors with the second electrode,
   wherein the charge generation layer includes $V_2O_5$, the electron transporting layer includes Cs:BCP and the hole transporting layer includes α-NPD,
   wherein the organic EL layer has a taper stack structure,
   wherein the first stack unit has greater area than the second stack unit, and the second stack unit has greater area than the third stack unit,
   wherein the first stack unit emits a blue light, the second stack unit emits a green light, and the third stack unit emits a red light,
   wherein the electrode separator has a shape of reverse taper, and
   wherein a side of the electrode separator is contacted with a side of the first stack unit, the second stack unit and the third stack unit,
   wherein the first stack unit, the second stack unit and the third stack unit are disposed in the electrode separator.

2. The organic EL device according to claim 1, wherein the first electrode is an anode and the second electrode is a cathode.

3. The organic EL device according to claim 1, wherein, when power is applied to the first and second electrodes, the charge generation layer generates and supplies electrons and holes to the electron transporting layer and the hole transporting layer.

4. An organic electroluminescence (EL) device, comprising:
   a first substrate and a second substrate spaced apart from each other by a predetermined interval and facing each other;
   an array element disposed below the first substrate, divided into sub-pixels and including thin film transistors formed in the sub-pixels;
   color filters including a red (R), green (G) and blue (B) conversion layer, sequentially arranged in a unit of sub-pixel below the second substrate;
   a first electrode disposed below the color filters and including a transparent conductive material;
   an electrode separator at a boundary of the sub-pixel and below the first electrode;
   an organic EL layer disposed below the first electrode in the sub-pixels, independently arranged in the unit of sub-pixel and including a plurality of stack units each including a charge generation layer (CGL), an electrode transporting layer (ETL), a hole transporting layer (HTL) and an emission layer (EMT), wherein the organic EL layer provides white light to the color filters;
   a second electrode patterned independently arranged in the unit of sub-pixel below the organic EL layer in the sub-pixels; and
   a conductive spacer electrically connecting the thin film transistors with the second electrode,
   wherein the emission layer includes a first emission layer containing a blue emission material, a second emission layer containing a green emission material and a third emission layer containing a red emission material; and
   wherein the organic EL layer includes the first unit including a first electron transporting layer (ETL), the first emission layer (EML), a first hole transporting layer (HTL), and a first charge generation layer (CGL) that are sequentially disposed starting from the first ETL contacting the first electrode, the second unit including a second ETL, the second EML, a second HTL, and a second CGL that are disposed below the first CGL, and the third unit including a third ETL, the third EML material and a third HTL that are disposed below the second CGL, wherein the CGL includes $V_2O_5$, the ETL includes Cs:BCP and the HTL includes α-NPD, wherein the organic EL layer has a taper stack structure, wherein the first stack unit has greater area than the second stack unit, and the second stack unit has greater area than the third stack unit, wherein the first stack unit emits a blue light, the second stack unit emits a green light, and the third stack unit emits a red light, wherein the electrode separator has a shape of reverse taper, and wherein a side of the electrode separator is contacted with a side of the first stack unit, the second stack unit and the third stack unit, wherein the first stack unit, the second stack unit and the third stack unit are disposed in the electrode separator.

5. The organic EL device according to claim 4, wherein, when the first electrode and the second electrode are designed to be cathode and anode, respectively.

6. The organic EL device according to claim 4, wherein, when power is applied to the first and second electrodes, the CGL generates and supplies electrons and holes to the adjacent ETL and HTL.

* * * * *